United States Patent
Tsai et al.

(10) Patent No.: US 8,462,887 B1
(45) Date of Patent: *Jun. 11, 2013

(54) RECEIVER EMPLOYING SELECTABLE A/D SAMPLE CLOCK FREQUENCY

(75) Inventors: King Chun Tsai, San Jose, CA (US); Patrick Clement, Belmont (CH); David Cousinard, Morges (CH)

(73) Assignee: Marvell International Ltd. (BM)

( * ) Notice: Subject to any disclaimer, the term of this patent is extended or adjusted under 35 U.S.C. 154(b) by 0 days.

This patent is subject to a terminal disclaimer.

(21) Appl. No.: 13/213,846

(22) Filed: Aug. 19, 2011

Related U.S. Application Data (63) Continuation of application No. 11/592,357, filed on Nov. 2, 2006, now Pat. No. 8,014,477.

(60) Provisional application No. 60/780,418, filed on Mar. 8, 2006, provisional application No. 60/780,647, filed on Mar. 9, 2006.

(51) Int. Cl.
*H04L 27/00* (2006.01)

(52) U.S. Cl.
USPC ........... 375/324; 375/327; 375/328; 375/340; 375/346; 375/347; 375/351; 455/150.1; 455/161.2; 455/161.3; 455/165.1; 455/179.1; 455/180.1; 455/182.1; 455/296; 455/302

(58) Field of Classification Search
USPC ................. 375/340, 346–349, 324, 327, 328, 375/351; 455/150.1, 179.1, 180.1, 182.1, 455/183.1, 183.2, 205, 214, 296, 161.2, 161.3, 455/165.1, 302; 329/315, 316, 318, 320, 329/323

See application file for complete search history.

(56) References Cited

U.S. PATENT DOCUMENTS

| | | | |
|---|---|---|---|
| 4,184,158 A | 1/1980 | Smith, II | |
| 4,461,026 A | 7/1984 | Priniski | |
| 4,905,305 A * | 2/1990 | Garner et al. | 455/183.2 |
| 5,694,089 A | 12/1997 | Adachi et al. | |
| 6,005,443 A | 12/1999 | Damgaard et al. | |
| 6,078,630 A | 6/2000 | Prasanna | |
| 6,385,262 B1 | 5/2002 | Gustafsson et al. | |
| 6,724,804 B1 | 4/2004 | Kegasa et al. | |
| 6,856,266 B2 | 2/2005 | Clement et al. | |
| 6,954,628 B2 | 10/2005 | Minnis et al. | |
| 7,272,373 B2 | 9/2007 | Tuttle et al. | |
| 7,317,774 B2 * | 1/2008 | Richey et al. | 375/355 |

(Continued)

FOREIGN PATENT DOCUMENTS

EP    0 803 997    * 10/1997

OTHER PUBLICATIONS

Barrett, Carol J., "Low-Power Decimation Filter Design for Multi-Standard Transceiver Applications," undated thesis, 90 pages.

(Continued)

*Primary Examiner* — Sophia Vlahos (57) ABSTRACT

A receiver is set forth that includes a tuner circuit and a converter circuit. The tuner circuit provides an analog signal corresponding to a modulated signal that is received on a selected channel. The converter circuit includes a sample clock that is used to convert the analog signal to a digital signal at a conversion rate corresponding to the frequency of the sample clock. The sample clock is selectable between at least two different clock frequencies.

20 Claims, 8 Drawing Sheets

U.S. PATENT DOCUMENTS

| | | | |
|---|---|---|---|
| 7,580,691 B1 * | 8/2009 | Reed et al. | 455/260 |
| 8,130,871 B2 * | 3/2012 | May et al. | 375/316 |
| 2002/0168951 A1 | 11/2002 | Paulus et al. | |
| 2003/0053562 A1 | 3/2003 | Busson et al. | |
| 2003/0198307 A1 * | 10/2003 | Neill et al. | 375/346 |
| 2005/0265486 A1 | 12/2005 | Crawley | |

OTHER PUBLICATIONS

Charoensak, C. et al., "FPGA Implementation of Efficient Kalman Band-Pass Sigma-Delta Filter for Application in FM Demodulation," *IEEE*, 2004, pp. 137-138.

Charoensak, C. et al., "System on Chip FPGA Design of an FM Demodulator using a Kalman Band-Pass Sigma-Delta Architecture," *IEEE*, 2005, pp. 33-36.

Hovin, M. et al., "A Narrow-Band Delta-Sigma Frequency-to-Digital Converter," *IEEE*, 1997, pp. 77-80.

McBride, Alan L., "On Optimum Sampled-Data FM Demodulation," *IEEE Transactions on Communications*, vol. Com-21, No. 1, Jan. 1973, pp. 40-50.

Park, J. et al., "A 5-MHz IF Digital FM Demodulator," *IEEE Journal of Solid-State Circuits*, vol. 34, No. 1, Jan. 1999, pp. 3-11.

Schnyder, F. et al., "Implementation of FM Demodulator Algorithms on a High Performance Digital Signal Processor," Diploma Thesis, Jan. 11, 2002, 174 pages.

Song, M. et al., "A Fully-Integrated 5MHz-IF Digital FM Demodulator," *IEEE*, 1997, pp. 525-528.

"Ultra-small, full-featured FM radio ICs—Philips FM stereo ICs with RDS and AM options TEA57xx for portable applications," Koninklijke Philips Electronics NV, 2006, 2 pages.

STw5094 specification, STMicroelectronics, Nov. 2003, 37 pages.
TDA7421 N specification, STMicroelectronics, Aug. 2000, 38 pages.
TDA7515 specification, STMicroelectronics, Jul. 2002, 5 pages.
TDA7518 specification, STMicroelectronics, Oct. 2004, 8 pages.
TDA7546 specification, STMicroelectronics, May 2006, 68 pages.

* cited by examiner

| RATE FOR DEMODULATOR = 352.8 KHz | | |
|---|---|---|
| OVERTONE | FS1 = 11.2896 Mhz | FS2 = 14.112 Mhz |
| 4th | 45.1584 Mhz | 56.448 Mhz |
| 5th | 56.4480 Mhz | 70.560 Mhz |
| 6th | 67.7376 Mhz | 84.672 Mhz |
| 7th | 79.0272 Mhz | 98.784 Mhz |
| 8th | 90.3168 Mhz | 112.896 Mhz |
| 9th | 101.6064 Mhz | 127.008 Mhz |
| 10th | 112.8960 Mhz | 141.120 Mhz |
| 11th | 124.1856 Mhz | 155.232 Mhz |
| 12th | 135.4752 Mhz | 169.344 Mhz |
| 14th | 158.0544 Mhz | 197.568 Mhz |
| 15th | 169.3440 Mhz | 211.68 Mhz |

Figure 6

| RATE FOR DEMODULATOR = 264.6 KHz | | |
|---|---|---|
| OVERTONE | FS1 = 10.584 Mhz | FS2 = 12.7008 Mhz |
| 5th | 52.920 Mhz | 63.504 Mhz |
| 6th | 63.504 Mhz | 76.2048 Mhz |
| 7th | 74.088 Mhz | 88.9056 Mhz |
| 8th | 84.672 Mhz | 101.6064 Mhz |
| 9th | 95.256 Mhz | 114.3072 Mhz |
| 10th | 105.840 Mhz | 127.0080 Mhz |
| 12th | 127.008 Mhz | 152.4096 Mhz |
| 13th | 137.592 Mhz | 165.1104 Mhz |
| 15th | 158.760 Mhz | 190.512 Mhz |
| 16th | 169.344 Mhz | 203.2128 Mhz |

Figure 7

| RATE FOR DEMODULATOR = 220.5 KHz | | |
|---|---|---|
| OVERTONE | FS1 = 10.584 Mhz | FS2 = 12.348 Mhz |
| 5th | 52.920 Mhz | 61.740 Mhz |
| 6th | 63.504 Mhz | 74.088 Mhz |
| 7th | 74.088 Mhz | 86.436 Mhz |
| 8th | 84.672 Mhz | 98.784 Mhz |
| 9th | 95.256 Mhz | 111.132 Mhz |
| 10th | 105.840 Mhz | 123.480 Mhz |
| 13th | 137.592 Mhz | 160.524 Mhz |
| 14th | 148.176 Mhz | 172.872 Mhz |
| 15th | 158.760 Mhz | 185.22 Mhz |
| 16th | 169.344 Mhz | 197.568 Mhz |

RECEIVER EMPLOYING SELECTABLE A/D SAMPLE CLOCK FREQUENCY

CROSS-REFERENCE TO RELATED APPLICATION

This application is a continuation application of U.S. Non-Provisional application Ser. No. 11/592,357, filed Nov. 2, 2006, which claims the benefit of U.S. Provisional Application No. 60/780,418, filed Mar. 8, 2006, and U.S. Provisional Application No. 60/780,647, filed Mar. 9, 2006. The contents of U.S. Non-Provisional application Ser. No. 11/592,357, U.S. Provisional Application No. 60/780,418 and U.S. Provisional Application No. 60/780,647 are hereby incorporated by reference in their entirety.

BACKGROUND

Receivers are used in a wide range of applications to convert modulated signals into a form that is suitable for other use. For example, frequency modulated (FM) broadcast receivers are used to convert radio frequency (RF) FM modulated signals to audio signals that can be heard by an individual user through, for example, a speaker system or the like. Other receivers may be used to convert modulated signals to, for example, baseband digital signals that may be used as input to a digital processing system. Cellular phones, televisions, cable boxes, DVD players and recorders, VCRs, and the like, each use at least one type of receiver to accomplish their respective functions.

Many receiver types may be implemented as purely analog circuits. However, receiver designs also may be implemented as hybrid systems that employ both analog and digital circuits. Conversion of analog signals to corresponding digital signals at various points in the reception/demodulation processes executed in such receivers takes place at sample clock rates chosen by the receiver designers. A single sample clock rate is used for a given analog-to-digital conversion in the receiver, although the sample clock rates for analog-to-digital conversions that take place in different portions of the receiver may differ. The sample clock rate selected by the designer is often the result of trade-offs between interference introduced by the analog-to-digital conversion at the sample clock rate and other receiver parameters, such as power consumption, etc. Such trade-offs typically result in a sample clock rate that is not truly optimal for the receiver design. Accordingly, an improvement in the analog-to-digital conversion process employed in such receivers is desirable.

SUMMARY

The present invention is defined by the following claims, and nothing in this section should be taken as a limitation on those claims.

By way of introduction, the embodiments described below provide a receiver employing a selectable analog-to-digital sample clock frequency. In one embodiment, the receiver includes a tuner circuit that provides an analog signal corresponding to a modulated signal that is received on a selected channel. The analog signal is provided to a converter circuit for conversion to a digital signal. The converter circuit includes a sample clock that is used to determine the rate of the analog-to-digital conversion operation. The sample clock is selectable between at least two different clock frequencies so that the conversion may take place at two different conversion rates. In another embodiment, selection of the frequency of the sample clock is dependent on the frequency of the selected channel. Other embodiments are provided, and each of the embodiments described herein can be used alone or in combination with one another.

The embodiments will now be described with reference to the attached drawings.

DETAILED DESCRIPTION OF THE PRESENTLY PREFERRED EMBODIMENTS

Figure 1:
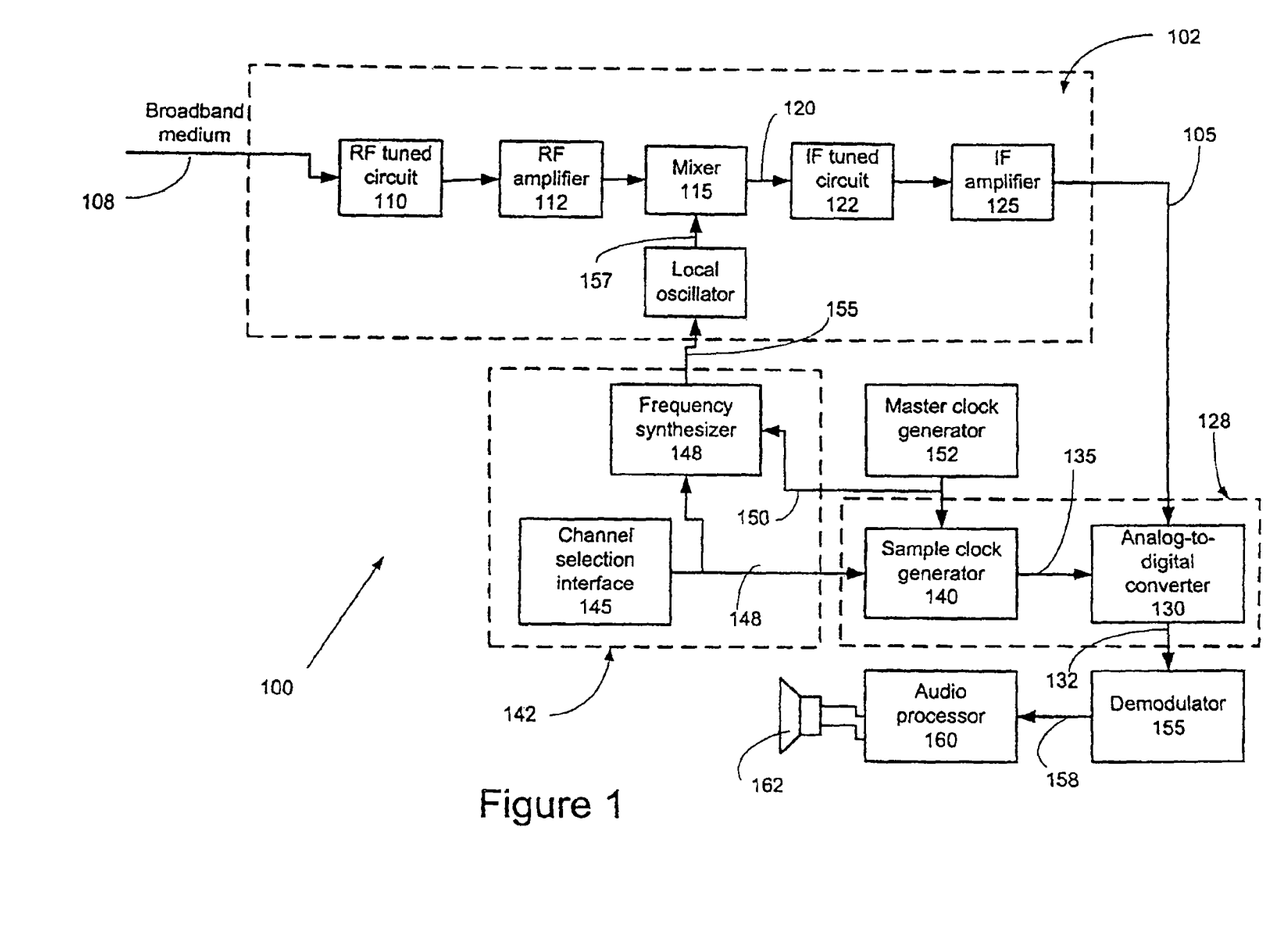
FIG. 1 is a schematic block diagram of an exemplary embodiment of a receiver employing a selectable analog-to-digital sample clock frequency.

FIG. 1 is a schematic block diagram of an exemplary embodiment of a receiver employing a selectable analog-to-digital sample clock frequency. In this example, the receiver 100 includes a tuner circuit 102. Tuner circuit 102 provides an analog signal output 105 that corresponds to a modulated signal that is selected for reception from one or more channels provided on broadband medium 108. Broadband medium 108, for example, may be wired or wireless. Wired implementations may include, for example, wired conductors, coaxial cable, optical cable, or the like. In wireless implementations, broadband medium 108 may comprise air, water, a vacuum, or the like. As such, the exemplary embodiment is not limited to any particular form of broadband medium.

Although the tuner circuit 102 may be constructed in a variety of different manners, the exemplary tuner circuit 102 of FIG. 1 is constructed as a superheterodyne tuner that is suitable for use, for example, in an FM broadcast receiver. To this end, one or more modulated signals are provided on broadband medium 108 to the input of an RF tuned circuit 110. RF tuned circuit 110, for example, performs a coarse tuning operation on the RF signals provided on medium 108.

The output of the RF tuned circuit 110 is provided to an RF amplifier 112 and therefrom to the input of a mixer 115. The mixer 115 uses the output signal from a local oscillator 118 to perform a mixing operation on the output of RF amplifier 112. The mixing operation generates a signal at mixer output 120 that includes the modulated signal at an intermediate frequency. Extraneous signals other than the modulated signal at the intermediate frequency are filtered by the IF tuned circuit 122 and the resulting modulated signal is amplified by IF amplifier 125 for provision as the analog signal output 105. When the tuner circuit 102 is used in connection with an FM broadcast receiver, the modulated signal received on broadband medium 108 as well as the analog signal output 105 are frequency modulated. However, receiver 100 may be used in connection other types of modulated signals, such as AM signals, phase modulated signals, OFDM signals, etc.

The analog signal output 105 of tuner circuit 102 is provided directly or indirectly for use at the input of a converter circuit 128. Converter circuit 128 employs an analog-to-digital converter 130 that converts analog signal output 105 to a corresponding digital signal output 132 at a conversion rate corresponding to the frequency of a sample clock signal 135. Analog-to-digital converter 130 may be constructed in a variety of different manners and, for example, may include a Sigma-Delta converter circuit topology. The sample clock signal 135 is provided by a sample clock generator 140.

The frequency used for the sample clock signal 135 may impact the overall operation of the receiver 100. For example, power consumption of the receiver 100 may increase at higher sampling frequencies. Further, overtones of the sample clock signal 135 may fall within the bandwidth of the received channel selected in the tuner circuit 102 thereby degrading reception of the tuned signal. Accordingly, the sample clock signal 135 provided by sample clock generator 140 is selectable between at least two different clock frequencies. The specific embodiment shown in FIG. 1 directs selection of the sample clock frequency based on the frequency of the selected bandlimited, received channel of tuner circuit 102. More particularly, the sample clock frequency may be selected so that its overtones do not lie in a bandwidth of the selected receiver channel.

Selection of the channel received by receiver 100 is facilitated using channel selection circuit 142. As shown, channel selection circuit 142 includes a channel selection interface 145 and a frequency synthesizer 148. Channel selection interface 145 provides an interface through which the channel that is to be received is selected. For example, interface 145 may include a user interface, such as a rotary dial, push buttons, etc., that allows the user to select the received channel. Additionally, or alternatively, interface 145 may include an interface that interacts with one or more automated components to select the received channel. Automated selection of the received channel may be used, for example, in cellular phones, repeaters, RF phones, and the like, which rapidly switch receive channels based on signal strength, channel bandwidth, channel conditions, etc.

Channel selection interface 145 provides a channel selection signal 148 either directly or indirectly to the input of the frequency synthesizer 148. The frequency synthesizer 148 uses the channel selection signal 148 in conjunction with a master clock signal 150 provided by master clock generator 152 in order to generate a signal 155 at the proper frequency to the local oscillator 118. The local oscillator 118, in turn, provides a mixing signal 157 to the mixer 115. Alternatively, signal 155 may be provided directly to mixer 115 as the mixing signal. Channel selection signal 148 may be either an analog or a digital signal that corresponds to the channel to which the receiver 100 is to be tuned. For example, channel selection signal 148 may correspond to the frequency of the tuned channel.

In those instances in which the sample clock generator 140 selects the frequency of the sample clock signal 135 based on the frequency of the received channel, channel selection signal 148 also may be provided to the sample clock generator 140. The sample clock generator 140, in turn, may use the master clock signal 150 in conjunction with the channel selection signal 148 to generate the sample clock signal 135 at the appropriate frequency.

As shown in FIG. 1, digital signal 132 is provided to the input of a demodulator 155. When the receiver 100 is implemented as an FM broadcast receiver, demodulator 155 may be in the form of a digital FM demodulator that provides a demodulated signal 158 either directly or indirectly to the input of an audio processor 160. Audio processor 160, in turn, may perform any desired audio filtering, equalization, amplification, etc. The processed audio is provided to one or more speakers 162.

Figure 2:
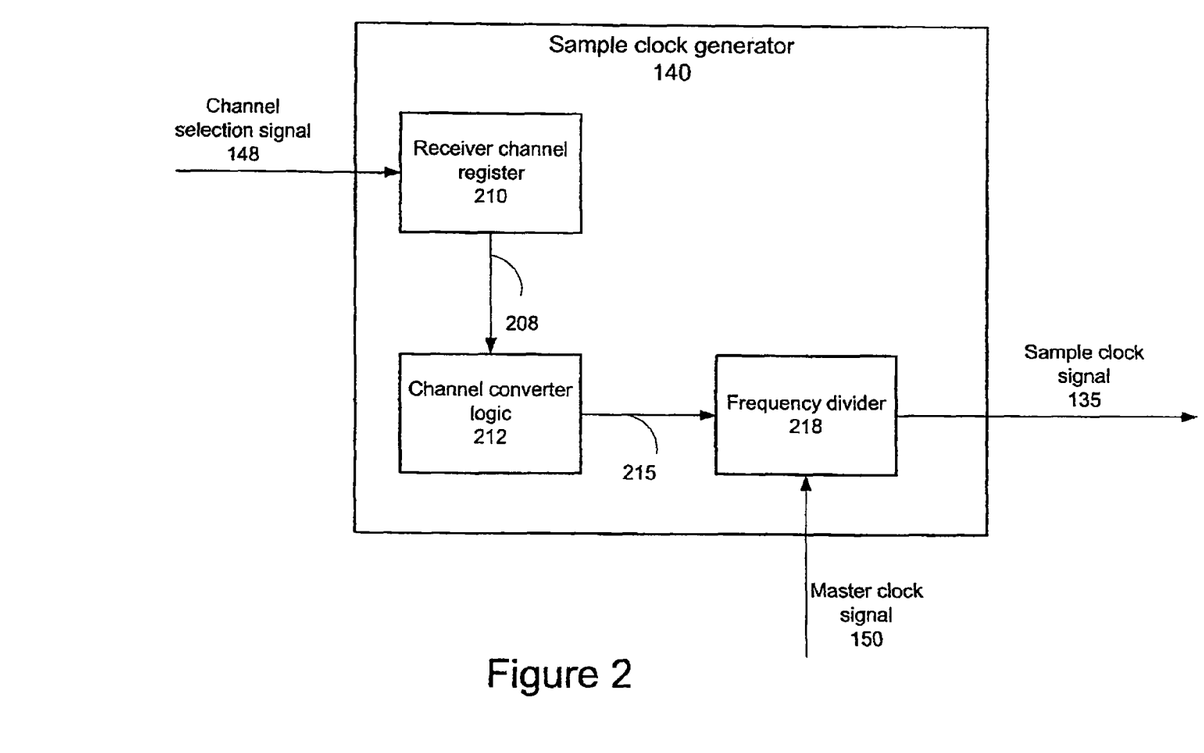
FIG. 2 is a schematic block diagram of an exemplary embodiment of a sample clock generator that, for example, may be used in connection with the receiver shown in FIG. 1.

FIG. 2 is a schematic block diagram of an exemplary embodiment of a sample clock generator 140 that, for example, may be used in connection with the receiver shown in FIG. 1. In the illustrated example, the channel selection signal 148 is provided to the input of a receiver channel register/buffer 210, which provides a digital channel selection signal 208. The digital channel selection signal 208 is accessible to a channel converter logic circuit 212. Channel converter logic circuit 212 responds to the value of the digital channel selection signal 208 stored in register 210 to generate a digital control value 215 to a frequency divider 218. Frequency divider 218 accepts master clock signal 150 and uses the digital control value 215 to determine the extent to which the master clock signal 150 is divided to generate the sample clock signal 135 at the proper frequency. For example, digital control value 215 may correspond to a divisor value that is used by the frequency divider 218 to divide the master clock signal 150. Multiple digital control values 215 may concurrently be provided from channel converter logic circuit 212 to multiple stages of frequency divider 218 to achieve the desired frequency division of the master clock signal 150.

Figure 3:
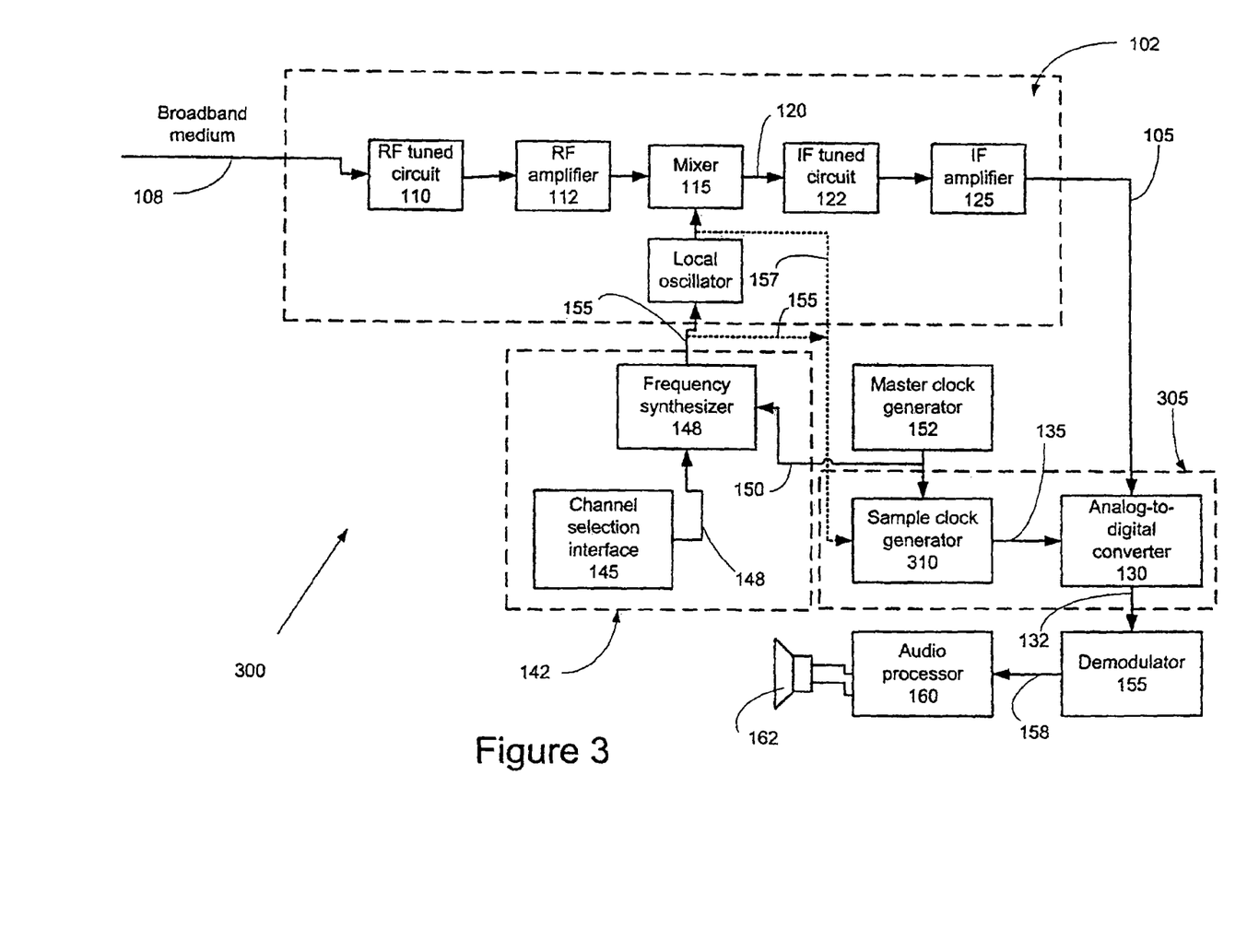
FIG. 3 is a schematic block diagram of another exemplary embodiment of a receiver employing a selectable analog-to-digital sample clock frequency.

FIG. 3 is a schematic block diagram of another exemplary embodiment of a receiver 300 employing a selectable analog-to-digital sample clock frequency. This embodiment may be relevant in systems in which the channel selection interface 145 and frequency synthesizer 148 are not integrated on the same chip with the other components. In such instances, channel frequency information is not directly accessible to converter 128. In this example, FIGS. 1 and 3 employ like reference numbers to designate like components.

One difference between receiver 100 and receiver 300 is in the converter circuit 305. More particularly, converter circuit 305 employs a sample clock generator 310 that is responsive to one or both of the signals 155 and/or 157. The frequency of each signal 155 and/or 157 corresponds to the frequency to which the tuner circuit 102 is tuned. As such, each signal 155 and/or 157 corresponds to the frequency of the received channel.

Figure 4:
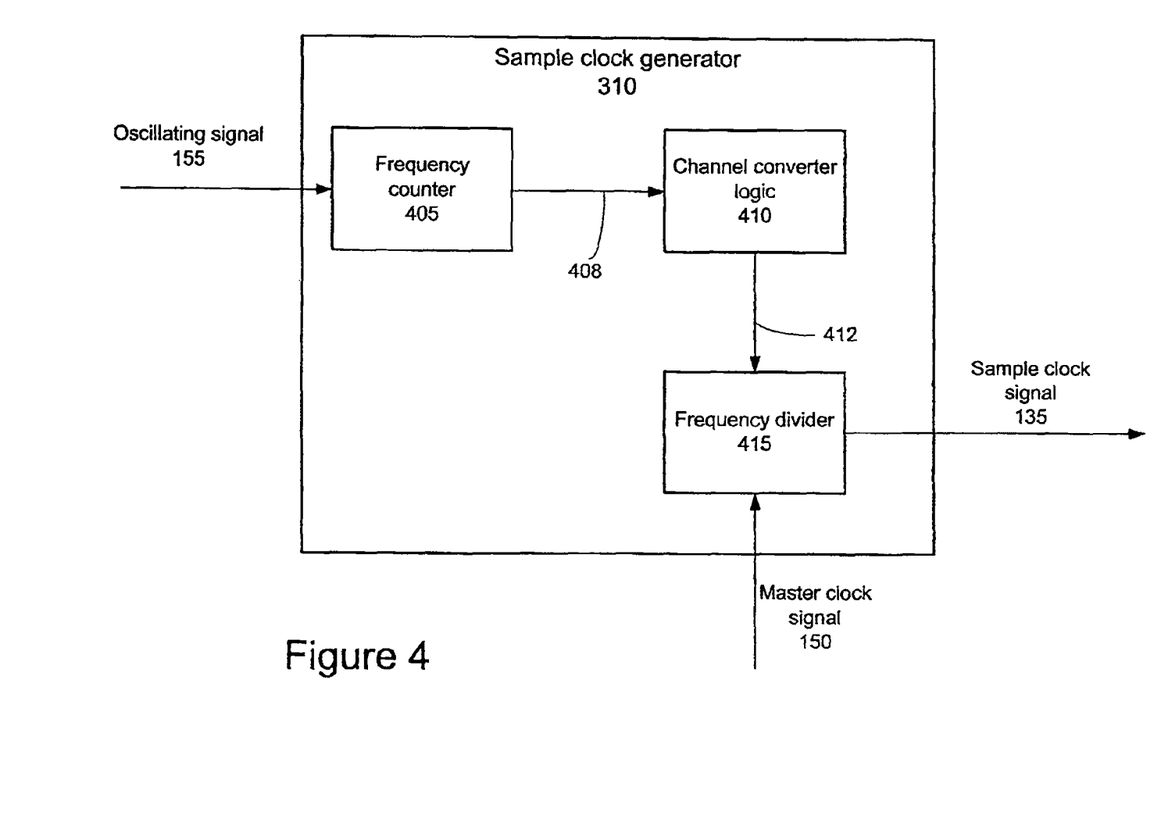
FIG. 4 is a schematic block diagram of an exemplary embodiment of a sample clock generator that, for example, may be used in connection with the receiver shown in FIG. 3.

FIG. 4 is a schematic block diagram of an exemplary embodiment of a sample clock generator that, for example, may be used in connection with the receiver shown in FIG. 3. As shown, an oscillating signal, such as signal 155, corresponding to the frequency of the received channel is provided to the input of a frequency counter 405. Frequency counter 405 provides a digital frequency value 408 to the input of a channel converter logic circuit 410. Channel converter logic circuit 410 responds to the value of the digital frequency value 408 to generate a digital control value 412 to a frequency divider 415. Frequency divider 415 accepts master clock signal 150 and uses the digital control value 412 to determine the extent to which the master clock signal 150 is divided to generate the sample clock signal 135 at the proper frequency. As noted above, digital control value 412 may correspond to a divisor value that is used by the frequency divider 415 to divide the master clock signal 150. Multiple digital control values 412 may concurrently be provided from channel converter logic circuit 410 to multiple stages of frequency divider 415 to achieve the desired frequency division of the master clock signal 150.

Figure 5:
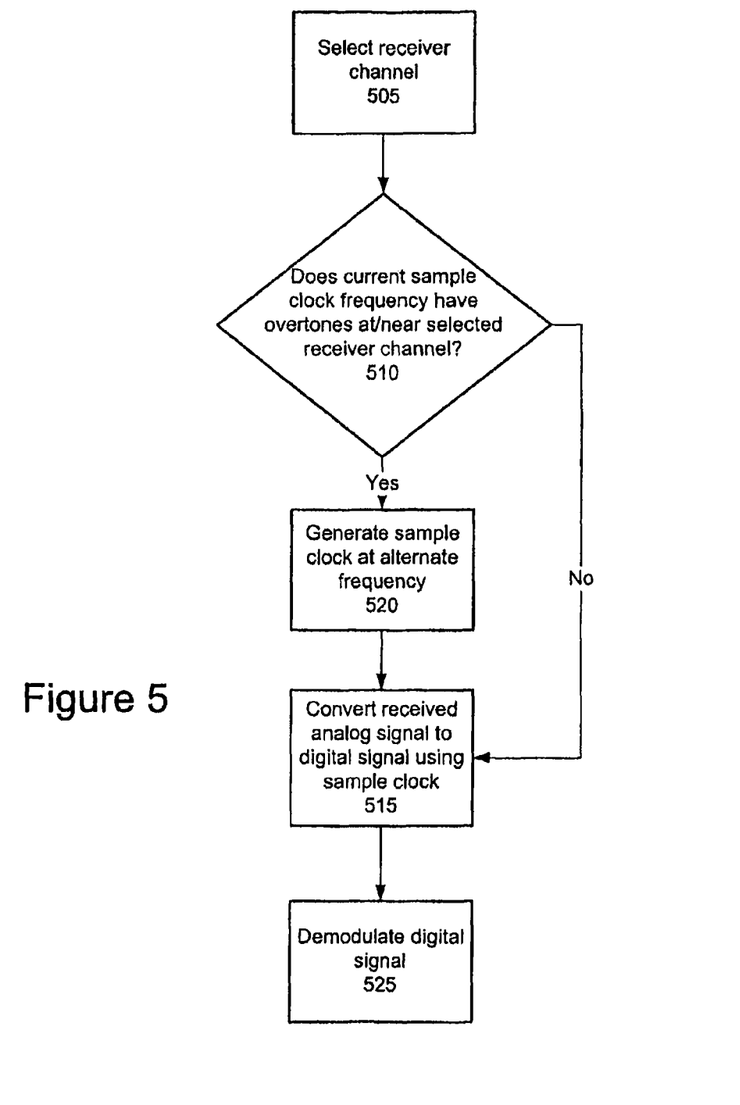
FIG. 5 is a flow chart showing a plurality of interrelated processes that may be used in the operation of a receiver employing a selectable analog-to-digital sample clock frequency.

FIG. 5 is a flow chart showing a plurality of interrelated processes that may be used in the operation of a receiver employing a selectable analog-to-digital sample clock frequency. As shown, a receiver channel is selected at block 505. This operation may be executed using the tuner circuits 102 and channel selection circuits 142 of receivers 100 and 300. At block 510, a check is made to determine whether the current sample clock frequency has overtones at or near the selected receiver channel. This operation may be executed, for example, by the sample clock generators 140 and 310 of receivers 100 and 300, respectively. In one embodiment, a comparison between the sample clock frequency overtones and the frequency of the received channel may be executed by the channel converter logic circuits 212 and 410. The particular bandwidth about the received channel that is used to determine whether overtones fall at or near the frequency of the received channel may be dependent on the target performance specifications for the receiver.

If overtones of the current sample clock do not fall at or near the frequency of the selected receiver channel, an analog signal corresponding to the modulated signal on the received channel is converted to a digital signal using the current frequency of the sample clock at block 515. However, if overtones of the current sample clock frequency fall at or near the frequency of the selected receiver channel, the sample clock is generated at an alternate frequency at block 520, which, in turn, is used at block 515 in the analog-to-digital conversion operation. The alternate frequency of the sample clock generated at block 520 is selected so that its overtones do not fall at or near the selected receiver channel.

The digital signal resulting from the analog-to-digital conversion is processed at block 525. In the illustrated example, the processing comprises demodulating the digital signal.

Figure 6:
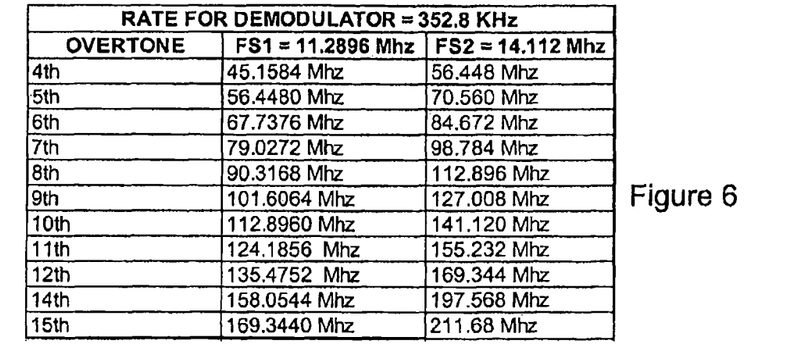
FIG. 6 is a chart illustrating the overtones for a pair of selectable sample clock frequencies that may be used in the conversion of an analog signal to a digital signal, where the digital signal is provided to, for example, a demodulator at a frequency of 352.8 kilohertz.
Figure 7:
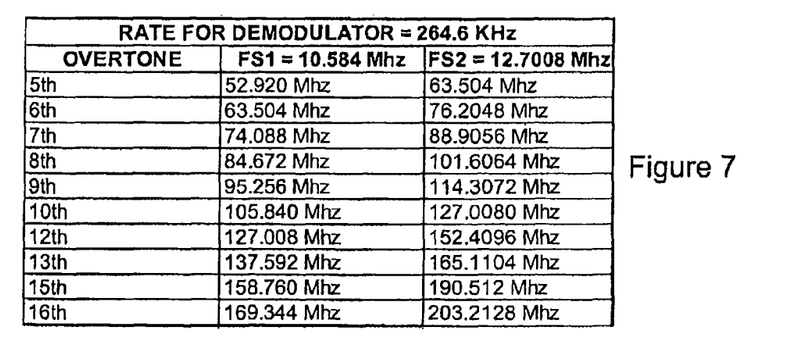
FIG. 7 is a chart illustrating the overtones for a pair of selectable sample clock frequencies that may be used in the conversion of an analog signal to a digital signal, where the digital signal is provided to, for example, a demodulator at a frequency of 264.6 kilohertz.
Figure 8:
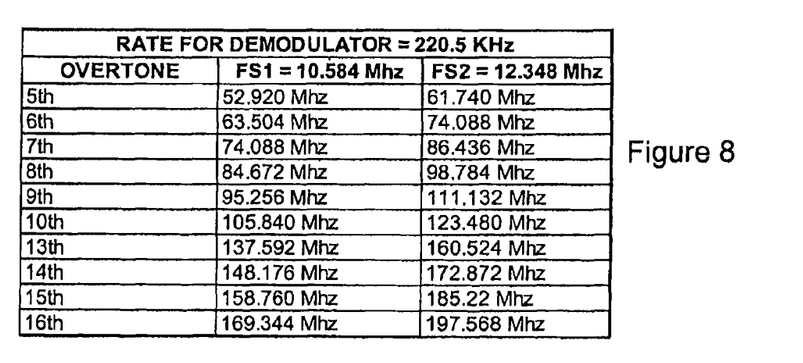
FIG. 8 is a chart illustrating the overtones for a pair of selectable sample clock frequencies that may be used in the conversion of an analog signal to a digital signal, where the digital signal is provided to, for example, a demodulator at a frequency of 220.5 kilohertz.

Exemplary applications of the foregoing principles to the design of an FM broadcast receiver can be understood in connection with the frequency charts of FIGS. 6-8. In each instance, the receive data clock is chosen to be a multiple of 44.1 kilohertz. To this end, the master clock signal 150 used in connection with the frequencies set forth in FIG. 6 is 56.448 megahertz (56.448 megahertz=88.2 kilohertz×128×5). The data rate of signal 132 to demodulator 155 is set to 352.8 kilohertz (352.8 kilohertz=88.2 kilohertz×4).

Two sample clock frequencies are employed in the example shown in FIG. 6. The first sample frequency, FS1, is at 11.2896 megahertz (11.2896 megahertz=56.448 megahertz/5), while the second sample frequency, FS2, is at 14.112 megahertz (14.112 megahertz=56.448 megahertz/4). Both frequencies are easily divided to reach the desired data rate of the signal 132 to demodulator 155 (352.8 kilohertz=11.2896 megahertz/4/8; 352.8 kilohertz=14.112 megahertz/5/8). Common overtones of both sample frequencies occur at 56.448 megahertz, 112.896 megahertz, and 169.344 megahertz. All of the common overtones are outside the FM broadcast band for the United States and European Union (87.5 megahertz-108 megahertz). Similarly, the common overtones are outside the FM broadcast band for Japan (76 megahertz-90 megahertz). The FM broadcast receiver also may be used to receive weather information on the standard weather channel (162.5 megahertz) since there are no common overtones at or near this frequency.

In the example shown in FIG. 7, the master clock signal 150 may be set to 63.504 megahertz (63.504 megahertz=88.2 kilohertz×3×3×8). The data rate of signal 132 to demodulator 155 is set to 264.4 kilohertz (264.4 kilohertz=88.2 kilohertz× 3). Two sample clock frequencies are employed in the example shown in FIG. 7. The first sample frequency, FS1, is at 12.7008 megahertz (12.7008 megahertz=63.504 megahertz/5), while the second sample frequency, FS2, is at 10.584 megahertz (10.584 megahertz=63.504 megahertz/6). Both frequencies are easily divided to reach the desired data rate of the signal 132 to demodulator 155 (264.4 kilohertz=12.008 megahertz/6/8; 264.4 kilohertz=10.584 megahertz/5/8). Common overtones of both sample frequencies occur at 63.504 megahertz, 127.008 megahertz, and 190.512 megahertz. All of the common overtones are outside the FM broadcast band for the United States and European Union (87.5 megahertz-108 megahertz). Similarly, the common overtones are outside the FM broadcast band for Japan (76 megahertz-90 megahertz). The FM broadcast receiver also may be used to receive weather information on the standard weather channel (162.5 megahertz) since there are no common overtones at or near this frequency.

In the example shown in FIG. 8, the master clock signal 150 may be set to 74.088 megahertz (74.088 megahertz=44.1 kilohertz×7×5×3×16). The data rate of signal 132 to demodulator 155 is set to 220.5 kilohertz (220.5 kilohertz=44.1 kilohertz×5). Two sample clock frequencies are employed in the example shown in FIG. 8. The first sample frequency, FS1, is at 12.348 megahertz (12.348 megahertz=74.088 megahertz/ 6), while the second sample frequency, FS2, is at 10.584 megahertz (10.584 megahertz=74.088 megahertz/7). Both frequencies are easily divided to reach the desired data rate of the signal 132 to demodulator 155 (220.5 kilohertz=12.348 megahertz/7/8; 220.5 kilohertz=10.584 megahertz/6/8). Common overtones of both sample frequencies occur at 74.088 megahertz, 148.176 megahertz, and 222.264 megahertz. All of the common overtones are outside the FM broadcast band for the United States and European Union (87.5 megahertz-108 megahertz). Similarly, the common overtones are outside the FM broadcast band for Japan (76 megahertz-90 megahertz). The FM broadcast receiver also may be used to receive weather information on the standard weather channel (162.5 megahertz) since there are no common overtones at or near this frequency.

Figure 9:
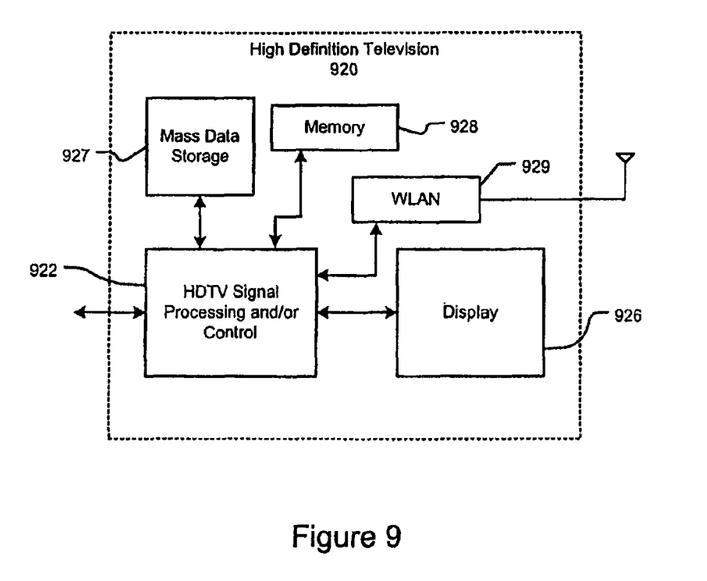
FIGS. 9-12 are schematic block diagrams of various systems that may emply a receiver employing a selectable analog-to-digital sample clock frequency.

Referring now to FIGS. 9 through 12, various exemplary uses of the receiver are shown. Referring now to FIG. 9, the receiver may be embodied in a high definition television (HDTV) 920. The receiver may be implemented in the signal processing and/or control circuits, which are generally identified in FIG. 9 at 922. HDTV 920 receives HDTV input signals in either a wired or wireless format and generates HDTV output signals for a display 926. In some implementations, signal processing circuit and/or control circuit 922 and/or other circuits (not shown) of HDTV 920 may process data, perform coding and/or encryption, perform calculations, format data and/or perform any other type of HDTV processing that may be required.

HDTV 920 may communicate with mass data storage 927 that stores data in a nonvolatile manner such as optical and/or magnetic storage devices. HDTV 920 may be connected to memory 928 such as RAM, ROM, low latency nonvolatile memory such as flash memory and/or other suitable electronic data storage. HDTV 920 also may support connections with a WLAN via a WLAN network interface 929.

Figure 10:
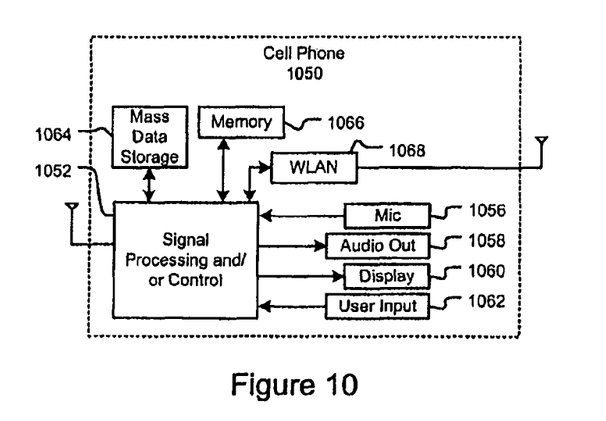

Referring now to FIG. 10, the receiver may be embodied in a cellular phone 1050 that may include a cellular antenna 1051. The receiver may be implemented in either or both signal processing and/or control circuits, which are generally identified in FIG. 10 at 1052. In some implementations, cellular phone 1050 includes a microphone 1056, an audio output 1058 such as a speaker and/or audio output jack, a display 1060 and/or an input device 1062 such as a keypad, pointing device, voice actuation and/or other input device. Signal processing and/or control circuits 1052 and/or other circuits (not shown) in cellular phone 1050 may process data, perform coding and/or encryption, perform calculations, format data and/or perform other cellular phone functions.

Cellular phone 1050 may communicate with mass data storage 1064 that stores data in a nonvolatile manner such as optical and/or magnetic storage devices for example hard disk drives HDD and/or DVDs. Cellular phone 1050 may be connected to memory 1066 such as RAM, ROM, low latency nonvolatile memory such as flash memory and/or other suitable electronic data storage. Cellular phone 1050 also may support connections with a WLAN via a WLAN network interface 1068.

Figure 11:
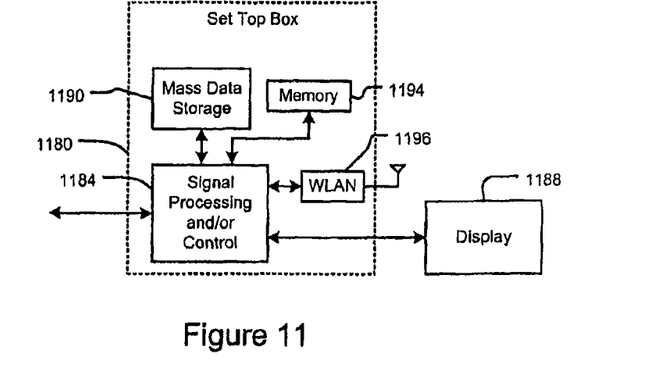

Referring now to FIG. 11, the receiver may be embodied in a set top box 1180. The receiver may be implemented in either or both the signal processing and/or control circuits, which are generally identified in FIG. 11 at 1184. Set top box 1180 receives signals from a source such as a broadband source and outputs standard and/or high definition audio/video signals suitable for a display 1188 such as a television and/or monitor and/or other video and/or audio output devices. Signal processing and/or control circuits 1184 and/or other circuits (not shown) of the set top box 1180 may process data, perform coding and/or encryption, perform calculations, format data and/or perform any other set top box function.

Set top box 1180 may communicate with mass data storage 1190 that stores data in a nonvolatile manner. Mass data storage 1190 may include optical and/or magnetic storage devices for example hard disk drives HDD and/or DVDs. Set top box 1180 may be connected to memory 1194 such as RAM, ROM, low latency nonvolatile memory such as flash memory and/or other suitable electronic data storage. Set top box 1180 also may support connections with a WLAN via a WLAN network interface 1196.

Figure 12:
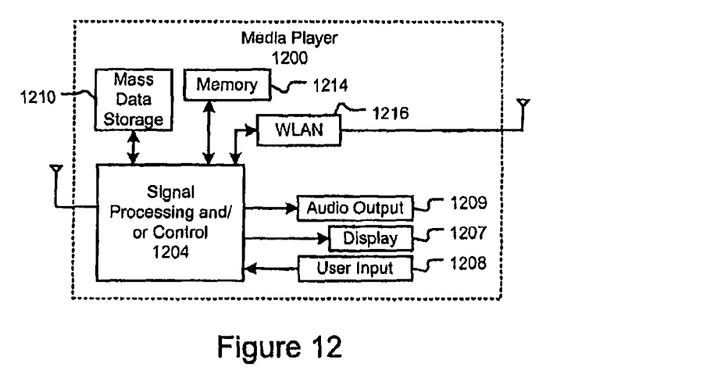

Referring now to FIG. 12, the receiver may be embodied in a media player 1200. The receiver may be implemented in either or both the signal processing and/or control circuits, which are generally identified in FIG. 12 at 1204. In some implementations, media player 1200 includes a display 1207 and/or a user input 1208 such as a keypad, touchpad and the like. In some implementations, media player 1200 may employ a graphical user interface (GUI) that typically employs menus, drop down menus, icons and/or a point-and-click interface via display 1207 and/or user input 1208. Media player 1200 further includes an audio output 1209 such as a speaker and/or audio output jack. Signal processing and/or control circuits 1204 and/or other circuits (not shown) of media player 1200 may process data, perform coding and/or encryption, perform calculations, format data and/or perform any other media player function.

Media player 1200 may communicate with mass data storage 1210 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. Media player 1200 may be connected to memory 1214 such as RAM, ROM, low latency nonvolatile memory such as flash memory and/or other suitable electronic data storage. Media player 1200 also may support connections with a WLAN via a WLAN network interface 1216. Still other implementations in addition to those described above are contemplated.

It is intended that the foregoing detailed description be understood as an illustration of selected forms that the invention can take and not as a definition of the invention. It is only the following claims, including all equivalents, that are intended to define the scope of this invention.

What is claimed is:

1. A method of converting an analog signal to a digital signal, the method comprising:
   receiving an analog signal corresponding to a selected channel;
   selecting a sample clock frequency from a plurality of different sample clock frequencies, the plurality of different sample clock frequencies being integer divisions of a master clock signal;
   determining whether a sample clock signal, generated with the selected sample clock frequency, has overtones outside of a predetermined bandwidth that includes a frequency of the selected channel;
   if the sample clock signal has overtones outside of the predetermined bandwidth, converting, with a converter circuit, the analog signal to a digital signal at a conversion rate based on the sample clock signal; and
   if the sample clock signal has overtones inside of the predetermined bandwidth, selecting another sample clock frequency from the plurality of different sample clock frequencies and converting the analog signal to the digital signal at a conversion rate based on the another sample clock signal, the another sample clock signal being generated with the another sample clock frequency,
   where the conversion rate based on the sample clock signal is the same as the conversion rate based on the another sample clock frequency.

2. The method of claim 1, where the sample clock frequency is a frequency of the master clock signal divided by a first control integer, and the another sample clock frequency is the frequency of the master clock signal divided by a second control integer, where the first control integer and the second control integer are successive integer values.

3. The method of claim 1, further comprising demodulating the digital signal.

4. The method of claim 3, where demodulating the digital signal comprises demodulating the digital signal with a digital FM demodulator.

5. The method of claim 1, where the converter circuit comprises a delta-sigma converter.

6. The method of claim 1, further comprising generating a channel selection signal indicative of the selected channel, the channel selection signal being used to generate at least one of a first control integer, a second control integer, a third control integer, or a fourth control integer, where the conversion rate is based on:
   the first control integer and the third control integer, or
   the second control integer and the fourth control integer, and
   where a ratio of the first control integer and the third control integer is the same as a ratio of the fourth control integer and the second control integer.

7. The method of claim 1, further comprising:
providing, with an RF receiving circuit of a tuner circuit, an RF output signal on the selected channel;
generating, with a local oscillator circuit of the tuner circuit, a mixing signal at a mixing signal frequency;
converting, with a mixer circuit of the tuner circuit, the RF output signal to an intermediate frequency signal using the mixing signal; and
providing, with an intermediate frequency filter circuit of the tuner circuit, a filtered intermediate frequency output signal as the analog signal.

8. The method of claim 1, further comprising:
generating the master clock signal, and
sending the master clock signal to the converter circuit.

9. The method of claim 1, where the frequency of the selected channel is at a center of the predetermined bandwidth.

10. A method of converting an analog signal to a digital signal, the method comprising:
receiving an analog signal corresponding to a selected channel;
generating a frequency value from a signal in a tuner circuit, the frequency value corresponding to a frequency of the selected channel;
selecting a plurality of control integer values based on the frequency value;
dividing a frequency of a master clock signal by the plurality of selected control integer values to generate a plurality of different sample clock frequencies, the frequency of the master clock signal being an integer multiple of the plurality of different sample clock frequencies;
selecting one of the plurality of different sample frequencies, the selection being based on whether overtones of at least one of the plurality of different sample clock frequencies are outside a predetermined bandwidth;
generating a sample clock signal based on the selected one of the plurality of sample clock frequencies; and
converting, with a converter circuit, the analog signal to a digital signal at a conversion rate based on the sample clock signal.

11. The method of claim 10, where the signal in the tuner circuit comprises a mixing signal.

12. The method of claim 10, where the signal in the tuner circuit comprises an input signal to a local oscillator circuit of the tuner circuit.

13. The method of claim 10, further comprising demodulating the digital signal.

14. The method of claim 13, where demodulating the digital signal comprises demodulating the digital signal with a digital FM demodulator.

15. The method of claim 10, where the converter circuit comprises a delta-sigma converter.

16. The method of claim 10, further comprising generating a channel selection signal indicative of the selected channel, the channel selection signal being used to generate the frequency value.

17. The method of claim 10, further comprising:
providing, with an RF receiving circuit of the tuner circuit, an RF output signal on the selected channel;
generating, with a local oscillator circuit of the tuner circuit, a mixing signal at a mixing signal frequency;
converting, with a mixer circuit of the tuner circuit, the RF output signal to an intermediate frequency signal using the mixing signal; and
providing, with an intermediate frequency filter circuit of the tuner circuit, a filtered intermediate frequency output signal as the analog signal.

18. The method of claim 10, further comprising:
generating the master clock signal, and
sending the master clock signal to the converter circuit.

19. The method of claim 10, where the frequency of the selected channel is at a center of the predetermined bandwidth.

20. The method of claim 10, where the plurality of different sample clock frequencies comprises two sample clock frequencies.

* * * * *